(12) United States Patent
Ko et al.

(10) Patent No.: US 9,243,166 B2
(45) Date of Patent: Jan. 26, 2016

(54) CURABLE COMPOSITION

(71) Applicant: LG CHEM, LTD., Seoul (KR)

(72) Inventors: Min Jin Ko, Daejeon (KR); Jae Ho Jung, Daejeon (KR); Bum Gyu Choi, Daejeon (KR); Dae Ho Kang, Daejeon (KR); Min Kyoun Kim, Daejeon (KR); Byung Kyu Cho, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/606,682

(22) Filed: Jan. 27, 2015

(65) Prior Publication Data

US 2015/0137171 A1 May 21, 2015

Related U.S. Application Data

(63) Continuation of application No. PCT/KR2013/006798, filed on Jul. 29, 2013.

(30) Foreign Application Priority Data

Jul. 27, 2012 (KR) .................. 10-2012-0082686
Jul. 29, 2013 (KR) .................. 10-2013-0089715

(51) Int. Cl.
  C08G 77/04 (2006.01)
  C09D 183/04 (2006.01)
  C08L 83/04 (2006.01)
  H01L 23/29 (2006.01)
  H01L 33/56 (2010.01)

(52) U.S. Cl.
  CPC .............. *C09D 183/04* (2013.01); *C08G 77/04* (2013.01); *C08L 83/04* (2013.01); *H01L 23/293* (2013.01); *H01L 33/56* (2013.01); *H01L 2924/0002* (2013.01)

(58) Field of Classification Search
  None
  See application file for complete search history.

(56) References Cited

U.S. PATENT DOCUMENTS

| 6,090,890 | A  | * | 7/2000  | Murakami et al. | 525/104 |
|-----------|----|---|---------|-----------------|---------|
| 7,863,399 | B2 |   | 1/2011  | Morita et al.   |         |
| 2004/0198925 | A1 | * | 10/2004 | Morita et al. | 525/525 |
| 2005/0080204 | A1 | * | 4/2005  | Furukawa et al. | 525/477 |
| 2009/0118440 | A1 | * | 5/2009  | Nakanishi et al. | 525/478 |
| 2009/0294796 | A1 | * | 12/2009 | Morita et al. | 257/100 |
| 2010/0171414 | A1 | * | 7/2010  | Tanikawa et al. | 313/502 |
| 2011/0160410 | A1 | * | 6/2011  | Sagawa et al. | 525/478 |
| 2012/0056236 | A1 | * | 3/2012  | Hamamoto et al. | 257/100 |
| 2013/0008507 | A1 | * | 1/2013  | Ko | 136/259 |
| 2013/0009200 | A1 | * | 1/2013  | Ko et al. | 257/100 |
| 2013/0009201 | A1 | * | 1/2013  | Ko et al. | 257/100 |
| 2013/0014820 | A1 | * | 1/2013  | Ko | 136/257 |
| 2013/0187176 | A1 | * | 7/2013  | Ko et al. | 257/88 |
| 2013/0338265 | A1 | * | 12/2013 | Masatomi et al. | 523/456 |
| 2014/0114042 | A1 | * | 4/2014  | Ko et al. | 528/31 |

FOREIGN PATENT DOCUMENTS

| JP | 11-274571 A | 10/1999 | |
| JP | 2001-196151 A | 7/2001 | |
| JP | 2002-226551 A | 8/2002 | |
| KR | 10-2006-0096429 A | 9/2006 | |
| KR | 10-2011-0087244 A | 8/2011 | |
| KR | 10-1159050 B1 | 6/2012 | |
| KR | 10-2012-0078606 A | 7/2012 | |
| WO | WO 2011090365 A2 * | 7/2011 | ............ H01L 34/102 |

OTHER PUBLICATIONS

International Search Report issued in International Application No. PCT/KR2013/006798 on Oct. 17, 2013, 2 pages.

* cited by examiner

*Primary Examiner* — Robert S Loewe
(74) *Attorney, Agent, or Firm* — Rothwell, Figg, Ernst & Manbeck, P.C.

(57) ABSTRACT

Provided are a curable composition and its use. The curable composition has excellent processability, workability and adhesiveness, exhibits excellent light extraction efficiency, crack resistance, hardness, thermal and shock resistance and adhesiveness after curing, has long-lasting durability and reliability even under harsh conditions, and does not cause whitening or surface stickiness. The curable composition can be used as an encapsulant or adhesive material for an optical semiconductor such as an LED.

20 Claims, No Drawings

CURABLE COMPOSITION

CROSS REFERENCE TO RELATED APPLICATIONS

The present application is a continuation of International Application No. PCT/KR2013/006798 with an international filing date of Jul. 29, 2013, which claims priority to and the benefit of Korean Patent Application No. 10-2012-0082686 filed on Jul. 27, 2012, and Korean Patent Application No. 10-2013-0089715 filed on Jul. 29, 2013, the disclosures of which are incorporated herein by reference in their entireties.

FIELD

The present application relates to a curable composition and its use.

BACKGROUND

A light-emitting diode (LED), for example, particularly a blue or ultraviolet (UV) LED having an emission wavelength of approximately 250 nm to 550 nm, is a high-brightness product using a GaN-based compound semiconductor such as GaN, GaAlN, InGaN or InAlGaN. In addition, it is possible to form a high-quality full-color image by a method of combining red and green LEDs with a blue LED. For example, a technique of manufacturing a white LED by combining a blue or UV LED with a fluorescent material is known. Such LEDs are widely used as backlights for liquid crystal displays (LCDs) or as lights.

As an LED encapsulant, an epoxy resin having high adhesiveness and excellent mechanical durability is widely used. However, the epoxy resin has lower light transmittance in a blue light or UV ray region, and low light resistance. For example, Japanese Patent Application Nos. H11-274571, 2001-196151 and 2002-226551 present techniques for addressing the above-described problems.

TECHNICAL OBJECT

The present application is directed to providing a curable composition and its use.

Solution

One aspect of the present application provides a curable composition including components that can be cured by hydrosilylation, for example, a reaction between an aliphatic unsaturated bond and a hydrogen atom.

For example, the curable composition may include a polymerization product including a polyorganosiloxane having an average compositional formula of Formula 1 (hereinafter, referred to as "polyorganosiloxane (A)"); a polyorganosiloxane having an average compositional formula of Formula 2 (hereinafter, referred to as "polyorganosiloxane (B)"); and a compound including a hydrogen atom binding to a silicon atom (hereinafter, referred to as "compound (C)").

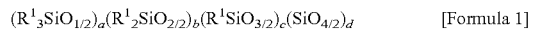   [Formula 1]

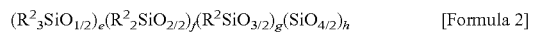   [Formula 2]

In Formulas 1 and 2, $R^1$ are monovalent hydrocarbon groups, $R^2$ are epoxy group or a monovalent hydrocarbon groups, at least one of $R^1$ is an alkenyl group, at least one of $R^2$ is an alkenyl group, at least one of $R^2$ is an epoxy group, a is 0 or a positive number, b is a positive number, c is 0 or a positive number, d is 0 or a positive number, e is a positive number, f is 0 or a positive number, g is a positive number, and h is 0 or a positive number. Here, b/(b+c+d) is 0.65 or more, and f/(f+g+h) is less than 0.65. In addition, in Formula 2, (e+f)/(e+f+g+h) may be 0.2 to 0.7, f/(f+g+h) may be 0.3 or less, and g/(g+h) may be 0.8 or more.

The expression "polyorganosiloxane is represented as a certain average compositional formula" used herein means that the polyorganosiloxane is a single component represented as a certain average compositional formula, or a mixture of at least two components, and an average of compositions of components in the mixture is represented as the average compositional formula.

The term "M unit" used herein may refer to a monofunctional siloxane unit possibly represented as $(R_3SiO_{1/2})$ in the art, the term "D unit" used herein may refer to a bifunctional siloxane unit possibly represented as $(R_2SiO_{2/2})$ in the art, the term "T unit" used herein may refer to a trifunctional siloxane unit possibly represented as $(RSiO_{3/2})$ in the art, and the term "Q unit" used herein may refer to a tetrafunctional siloxane unit possibly represented as $(SiO_{4/2})$. Here, R is a functional group binding to a silicon (Si) atom, and may be, for example, a hydrogen atom, an epoxy group, or a monovalent hydrocarbon group.

The term "epoxy group" used herein may refer to, unless particularly defined otherwise, a monovalent residue derived from a cyclic ether having three ring-forming atoms or a compound including the cyclic ether. The epoxy group may be a glycidyl group, an epoxyalkyl group, a glycidoxyalkyl group or an alicyclic epoxy group. An alicyclic epoxy group may include a monovalent residue derived from a compound including an alicyclic hydrocarbon ring structure, and a structure of an epoxy group formed by two carbon atoms of the alicyclic hydrocarbon ring. The alicyclic epoxy group may be an alicyclic epoxy group having 6 to 12 carbon atoms, for example, a 3,4-epoxycyclohexylethyl group.

The term "monovalent hydrocarbon group" used herein, unless particularly defined otherwise, may refer to a monovalent residue derived from a compound composed of carbon and hydrogen or a derivative thereof. For example, the monovalent hydrocarbon group may include 1 carbon atoms to 25 carbon atoms. The monovalent hydrocarbon group may be an alkyl group, an alkenyl group, an alkynyl group, or an aryl group.

The term "alkyl group" used herein may refer to, unless particularly defined otherwise, an alkyl group having 1 carbon atoms to 20 carbon atoms, 1 carbon atoms to 16 carbon atoms, 1 carbon atoms to 12 carbon atoms, 1 carbon atoms to 8 carbon atoms, or 1 carbon atoms to 4 carbon atoms. The alkyl group may have a linear, branched or cyclic structure. In addition, the alkyl group may be optionally substituted with at least one substituent.

The term "alkenyl group" used herein may refer to, unless particularly defined otherwise, an alkenyl group having 2 carbon atoms to 20 carbon atoms, 2 carbon atoms to 16 carbon atoms, 2 carbon atoms to 12 carbon atoms, 2 carbon atoms to 8 carbon atoms, or 2 carbon atoms to 4 carbon atoms. The alkenyl group may have a linear, branched or cyclic structure, and may be optionally substituted with at least one substituent.

The term "alkynyl group" used herein may refer to, unless particularly defined otherwise, an alkynyl group having 2 carbon atoms to 20 carbon atoms, 2 carbon atoms to 16 carbon atoms, 2 carbon atoms to 12 carbon atoms, 2 carbon atoms to 8 carbon atoms, or 2 carbon atoms to 4 carbon atoms.

The alkynyl group may have a linear, branched or cyclic structure, and may be optionally substituted with at least one substituent.

The term "aryl group" used herein may refer to, unless particularly defined otherwise, a monovalent residue derived from a compound including a benzene ring or a structure in which at least two benzene rings are condensed or connected by a covalent bond with one or two carbon atoms, or a derivative thereof. In the range of the aryl group, a functional group conventionally referred to as an aralkyl group or arylalkyl group may be included, in addition to a functional group conventionally referred to as an aryl group. The aryl group may be, for example, an aryl group having 6 carbon atoms to 25 carbon atoms, 6 carbon atoms to 21 carbon atoms, 6 carbon atoms to 18 carbon atoms, or 6 carbon atoms to 12 carbon atoms. The aryl group may be a phenyl group, a dichlorophenyl group, a chlorophenyl group, a phenylethyl group, a phenylpropyl group, a benzyl group, a tolyl group, a xylyl group, or a naphthyl group.

As a substituent that may be optionally substituted for an epoxy group or a monovalent hydrocarbon group, a halogen such as chlorine or fluorine, a glycidyl group, an epoxyalkyl group, a glycidoxyalkyl group, an epoxy group such as an alicyclic epoxy group, an acryloyl group, a methacryloyl group, an isocyanate group, a thiol group, or a monovalent hydrocarbon group may be used, but the present application is not limited thereto.

The polyorganosiloxane (A) may have, for example, a linear structure or a partially-crosslinked structure. The term "linear structure" may refer to a structure of a polyorganosiloxane composed of the M and D units. In addition, the term "partially-crosslinked structure" may refer to a sufficiently long linear structure of a polyorganosiloxane, which is derived from the D unit, and to which the T or Q unit, for example, the T unit, is partially introduced. In one embodiment, the polyorganosiloxane having a partially-crosslinked structure may refer to a polyorganosiloxane having a ratio of the D unit with respect to all D, T and Q units, that is, b/(b+c+d) in Formula 1, of 0.65 or more, or 0.7 or more and less than 1.

In the average compositional formula of Formula 1, a, b, c and d are each a molar ratio of siloxane units of the polyorganosiloxane (A). For example, when a sum of the molar ratios (a+b+c+d) is adjusted to be 1, a may be 0.5 or 0.01 to 0.15, b may be 0.3 to 0.98, or 0.5 to 0.9, c may be 0 to 0.3, or 0 to 0.2, and d may be 0 to 0.2, or 0 to 0.1. When the polyorganosiloxane (A) has a partially-crosslinked structure, c may be 0.01 to 0.30. In addition, b/(b+c+d) may be 0.65 to 1, or 0.7 to 1. When the polyorganosiloxane (A) has a partially-crosslinked structure, b/(b+c+d) may be 0.65 or 0.7 or more and less than 1, 0.65 to 0.97, or 0.7 to 0.97. As a ratio of the siloxane units is controlled as described above, suitable physical properties according to an application can be ensured.

The polyorganosiloxane (A) may include at least one aliphatic unsaturated bond or functional group including the same, for example, an alkenyl group. Accordingly, in Formula 1, at least one $R^1$ may be an alkenyl group. For example, a ratio (Ak/Si) of moles (Ak) of a functional group including the aliphatic unsaturated bond and moles (Si) of total silicon atoms included in the polyorganosiloxane (A) may be 0.01 or more, or 0.02 or more. The ratio (Ak/Si) may also be 0.2 or less, or 0.15 or less. As the molar ratio (Ak/Si) is controlled to 0.01 or more, or 0.02 or more, reactivity can be suitably maintained, and leakage of an unreacted component from a cured product can be prevented. In addition, as the molar ratio (Ak/Si) is controlled to 0.2 or less, or 0.15 or less, crack resistance of the cured product can be excellently maintained.

The polyorganosiloxane (A) may include an aryl group, for example, at least one aryl group binding to a silicon atom. When the polyorganosiloxane (A) includes an aryl group, in Formula 1, at least one $R^1$ may be an aryl group. In this case, for example, a ratio of moles (Ar) of the aryl groups bonding to all silicon atoms included in the polyorganosiloxane (A) to moles (Si) of all silicon atoms included in the polyorganosiloxane (A) may be 0.5 to 1.5. Within the above range, the composition can have excellent processability and workability, and exhibit excellent water resistance, light dispersity, light transmittance and hardness, after curing.

The polyorganosiloxane (A) may include a unit of Formula 4 and a unit of Formula 5 as D units.

$$(R^1R^2SiO_{2/2}) \qquad \text{[Formula 2]}$$

$$(R^3{}_2SiO_{2/2}) \qquad \text{[Formula 3]}$$

In Formulas 4 and 5, $R^1$ and $R^2$ are each independently an epoxy group or a monovalent hydrocarbon group, and $R^3$ is an aryl group. In one embodiment, $R^1$ and $R^2$ are each independently an alkyl group.

In the polyorganosiloxane (A), a ratio (Dm/Dp) of moles of the siloxane unit of Formula 4 (Dm) to moles of the siloxane unit of Formula 5 (Dp) may be, for example, approximately 0.3 to 2.0, 0.3 to 1.5, or 0.5 to 1.5. Within such a range of the ratio, a curable composition can have excellent light transmittance and mechanical strength, and no surface stickiness, and can ensure long-lasting durability by controlling water and gas permeability.

A percentage (100×Dp/D) of moles of the siloxane unit of Formula 5 (Dp) with respect to moles of all D units (D) in the polyorganosiloxane (A) may be approximately 30% or more, 30% to 65%, or 30% to 60%. Within such a range, the curable composition can have excellent light transmittance and mechanical strength, and no surface stickiness, and can ensure long-lasting durability by controlling water and gas permeability.

A percentage (100×Dp/ArD) of moles of the siloxane unit of Formula 5 (Dp) with respect to moles of D units including an aryl group (ArD) of all D units in the polyorganosiloxane (A) may be approximately 70% or 80% or more. The upper limit of the percentage (100×Dp/ArD) is not particularly limited, and may be, for example, 100%. Within such a range, the curable composition having excellent processability and workability before curing, and having excellent mechanical strength, gas permeability, water resistance, light transmittance, refractive index, light extraction efficiency, and hardness after curing, can be provided.

When the polyorganosiloxane (A) has a partially-crosslinked structure, it may include a unit of Formula 6 or 7.

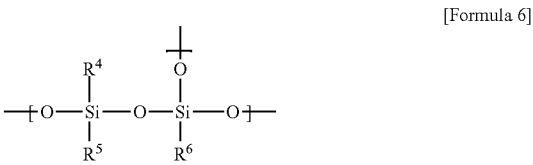

[Formula 6]

In Formula 6, $R^4$, $R^5$ and $R^6$ are each independently an alkyl group having 1 carbon atoms to 20 carbon atoms, an alkenyl group having 2 carbon atoms to 20 carbon atoms, or an aryl group having 6 carbon atoms to 25 carbon atoms. In Formula 6, at least one of $R^4$, $R^5$ and $R^6$ may be an alkenyl group. In addition, in Formula 6, R6 may be, in another example, an aryl group, for example, an aryl group having 6 carbon atoms to 25 carbon atoms, 6 carbon atoms to 21 carbon atoms, 6 carbon atoms to 18 carbon atoms, or 6 carbon atoms to 13 carbon atoms, or a phenyl group.

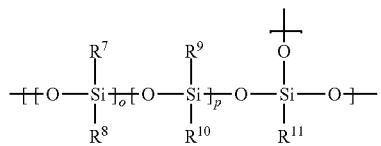
[Formula 7]

In Formula 7, $R^7$ is an aryl group having 6 carbon atoms to 25 carbon atoms, $R^8$ to $R^{10}$ are each independently an alkyl group having 1 carbon atoms to 20 carbon atoms, an alkenyl group having 2 carbon atoms to 20 carbon atoms, or an aryl group having 6 carbon atoms to 25 carbon atoms, and $R^H$ is an alkyl group having 1 carbon atoms to 20 carbon atoms, or an aryl group having 6 carbon atoms to 25 carbon atoms. In Formula 6, at least one of $R^8$ to $R^{10}$ may be an alkenyl group.

The polyorganosiloxane (A) having an exemplary partially-crosslinked structure may include at least one unit of Formula 6 or 7. The unit of Formula 6 or 7 may be of a type such that a silicon atom of the D unit and a silicon atom of the T unit among the siloxane units included in the polyorganosiloxane (A) are directly bound to each other by means of an oxygen atom. When the polyorganosiloxane (A) is a mixture of at least two components and represented as the average compositional formula of Formula 1, the polyorganosiloxane (A) may include at least one single component having the unit of Formula 6 or 7. The polyorganosiloxane including the unit of Formula 6 or 7 may be prepared by, for example, ring-opening polymerization, which will be described below. According to the method, a polyorganosiloxane including the unit of Formula 6 or 7 and having minimized alkoxy group-binding silicon atoms and hydroxyl group-binding silicon atoms can be prepared.

In one embodiment, the polyorganosiloxane (A) may have a ratio (OR/Ak) of an area (OR) of peak derived from an alkoxy group binding to a silicon atom with respect to an area (Ak) of a peak derived from an alkenyl group binding to a silicon atom in a spectrum obtained by $^1$H NMR of 0.05 or less, 0.03 or less, 0.01, 0.005 or less, or 0. In the above range, suitable viscosity can be exhibited, and other physical properties can be excellently maintained.

The polyorganosiloxane (A) may have an acid value obtained by KOH titration of 0.05 mgKOH/g or less, 0.03 mgKOH/g or less, 0.01 mgKOH/g or less, or 0 mgKOH/g. In the above range, suitable viscosity can be exhibited, and other physical properties can be excellently maintained.

The polyorganosiloxane (A) may have a viscosity at 25° C. of 500 cP or more, 1000 cP or more, 2000 cP or more, 3000 cP or more, 4000 cP or more, 5000 cP or more, 7000 cP or more, 9000 cP or more, or 9500 cP or more. In the above range, processability and hardness can be suitably maintained. The upper limit of the viscosity is not particularly limited, and the viscosity may be, for example, 300000 cP or less, 200000 cP or less, 100000 cP or less, 90000 cP or less, 80000 cP or less, 70000 cP or less, or 65000 cP or less.

The polyorganosiloxane (A) may have a weight average molecular weight (Mw) of 1000 to 1000000, or 1000 to 100000. The term "weight average molecular weight" used herein may refer to a conversion value with respect to standard polystyrene measured by gel permeation chromatography (GPC). Unless particularly defined otherwise, the term "molecular weight" used herein may refer to a weight average molecular weight. In such a range, moldability, and hardness and strength of the curable composition after curing, can be suitably maintained.

The polyorganosiloxane (A) may be prepared by ring-opening polymerization of a cyclic siloxane compound. For example, the polyorganosiloxane (A) may be a component included in a ring-opening polymerization product of a mixture including a cyclic polyorganosiloxane. The polymerization product may include a low molecular weight cyclic compound along with the polyorganosiloxane (A) according to a result of the polymerization. The term "low molecular weight cyclic compound" may refer to a cyclic compound, for example, a cyclic polyorganosiloxane, having a molecular weight of 800 or less, 750 or less, or 700 or less. The polymerization product may include the low molecular weight cyclic compound in an amount of, for example, 10 weight %, 7 weight %, 5 weight %, or 3 weight % or less. The lower limit of the ratio of the cyclic compound may be, for example, 0 weight % or 1 weight %. By controlling the ratio as described above, a cured product having excellent long-lasting reliability and crack resistance can be provided.

The low molecular weight cyclic compound may include, for example, a compound represented by Formula 8.

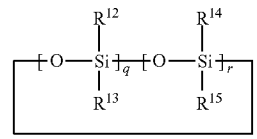
[Formula 8]

In Formula 8, $R^{12}$ and $R^{13}$ are each independently an alkyl group, $R^{14}$ and $R^{15}$ are each independently an aryl group, q and r each may be 0 or a positive number, a sum of g and r (g+r) may be 2 to 10, 3 to 10, 3 to 9, 3 to 8, 3 to 7, or 3 to 6.

The cyclic polyorganosiloxane included in the mixture forming the polyorganosiloxane (A) by ring-opening polymerization may be, for example, a compound represented by Formula 9.

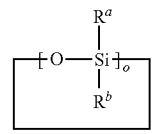
[Formula 9]

In Formula 9, $R^a$ and $R^b$ are each independently a monovalent hydrocarbon group, and o is 3 to 6.

The cyclic polyorganosiloxane included in the mixture forming the polyorganosiloxane (A) by ring-opening polymerization may be, in another example, a mixture of a compound of Formula 10 and a compound of Formula 11.

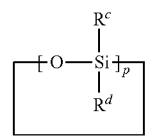
[Formula 10]

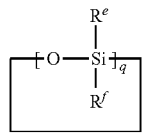

[Formula 11]

In Formulas 10 and 11, $R^c$ and $R^d$ are each an alkyl group, $R^e$ and $R^f$ are each an aryl group, p is a number of 3 to 6, and q is a number of 3 to 6.

In Formulas 9 to 11, specific kinds of $R^a$ to $R^f$, specific values of o, p and q, and a ratio of components in the mixture may be determined by, for example, a desired structure of the polyorganosiloxane (A).

When the polyorganosiloxane (A) is a partially-crosslinked structure, the mixture applied to the ring-opening polymerization may further include, for example, a compound having an average compositional formula of Formula 12 or a compound having an average compositional formula of Formula 13.

$$[R^g SiO_{3/2}]$$ [Formula 12]

$$[R^h R^i{}_2 SiO_{1/2}]_p [R^g SiO_{3/2}]_q$$ [Formula 13]

In Formulas 12 and 13, $R^g$ to $R^i$ are each independently a monovalent hydrocarbon group, p is 1 to 3, and q is 1 to 10. When the polyorganosiloxane having an average compositional formula of Formula 13 has a partial cage structure, p may be 1 to 2, and q may be 3 to 10.

In Formulas 12 to 13, specific kinds of $R^g$ to $R^i$, specific values of p and q, and ratio of components in the mixture may be determined by, for example, a desired structure of the polyorganosiloxane (A).

When the cyclic polyorganosiloxane, for example, at least one of the polyorganosiloxanes of Formulas 9 to 11, reacts with a polyorganosiloxane having a cage and/or partial cage structure such as that of Formula 12 or 13, a polyorganosiloxane having a desired structure and a suitable molecular weight can be synthesized. In addition, according to the above-described method, functional groups such as alkoxy or hydroxyl groups binding to silicon atoms in the polyorganosiloxane or a polymerization product including the same can be minimized, so that a desired product having excellent physical properties can be produced.

In one embodiment, the mixture applied to ring-opening polymerization may further include a compound represented by Formula 14.

$$(R^h R^i{}_2 Si)_2 O$$ [Formula 14]

In Formula 14, $R^h$ and $R^i$ are each a monovalent hydrocarbon group.

In Formula 14, a specific kind of the monovalent hydrocarbon group or a blending ratio in the mixture may be determined by the desired polyorganosiloxane (A).

A reaction of the components in the mixture may be performed in the presence of a suitable catalyst. Accordingly, the mixture may further include a catalyst.

As a catalyst, for example, a base catalyst may be used. As a suitable base catalyst, a metal hydroxide such as KOH, NaOH or CsOH, a metal silanolate including an alkali metal compound and a siloxane, or a quaternary ammonium compound such as tetramethylammonium hydroxide, tetraethylammonium hydroxide, or tetrapropylammonium hydroxide may be used, but the present application is not limited thereto.

A ratio of the catalyst in the mixture may be suitably selected in consideration of desired reactivity, and for example, may be 0.01 parts by weight to 30 parts by weight, or 0.03 parts by weight to 5 parts by weight with respect to 100 parts by weight of a total weight of the reaction products in the mixture. In the specification, unless specifically defined otherwise, the units "parts by weight" refer to a weight ratio between components.

In one embodiment, the reaction may be performed in the presence of a suitable solvent. As a solvent, the reaction product in the mixture, that is, a disiloxane or polysiloxane, may be suitably mixed with a catalyst, and any kind of solvent that does not interfere with reactivity may be used. The solvent may be, but is not limited to, an aliphatic hydrocarbon-based solvent such as n-pentane, i-pentane, n-hexane, i-hexane, 2,2,4-trimethyl pentane, cyclohexane or methylcyclohexane; an aromatic solvent such as benzene, toluene, xylene, trimethyl benzene, ethyl benzene or methylethyl benzene; a ketone-based solvent such as methylethylketone, methylisobutylketone, diethylketone, methyl n-propyl ketone, methyl n-butyl ketone, cyclohexanone, methylcyclohexanone or acetylacetone; an ether-based solvent such as tetrahydrofuran, 2-methyl tetrahydrofuran, ethyl ether, n-propyl ether, isopropyl ether, diglyme, dioxine, dimethyldioxine, ethyleneglycol monomethyl ether, ethyleneglycol dimethyl ether, ethyleneglycol diethyl ether, propyleneglycol monomethyl ether or propyleneglycol dimethyl ether; an ester-based solvent such as diethyl carbonate, methyl acetate, ethyl acetate, ethyl lactate, ethyleneglycol monomethylether acetate, propyleneglycol monomethylether acetate or ethyleneglycol diacetate; or an amide-based solvent such as N-methyl pyrrolidone, formamide, N-methyl formamide, N-ethyl formamide, N,N-dimethyl acetamide or N,N-diethylacetamide.

The reaction of the mixture, for example, the ring-opening polymerization, may be performed by adding the catalyst. For example, the reaction may be performed at a reaction temperature within a range of, for example, 0° C. to 150° C., or 30° C. to 130° C. In addition, a reaction time may be controlled within a range of, for example, 1 hour to 3 days.

The polyorganosiloxane (B) included in the curable composition may be, for example, a polyorganosiloxane including at least one alkenyl group and at least one epoxy group. The polyorganosiloxane (B) may be a crosslinkable polyorganosiloxane. The term "crosslinkable polyorganosiloxane" used herein may refer to a polyorganosiloxane necessarily including a T or Q unit as a siloxane unit, and having a ratio of the D unit with respect to all D, T and Q units, for example, in Formula 2, f/(f+g+h), of less than 0.65.

In Formula 2, at least one or two of $R^2$ may be an alkenyl group. In one embodiment, a ratio (Ak/Si) of moles of the alkenyl group (Ak) to moles of all silicon atoms (Si) included in the polyorganosiloxane (B) may be 0.05 or more, or 0.15 or more. The ratio (Ak/Si) may also be 0.4 or less, 0.35 or less, or 0.3 or less. As the molar ratio (Ak/Si) is controlled to 0.05 or more, or 0.15 or more, reactivity can be suitably maintained, and leakage of an unreacted component from a cured product can be prevented. In addition, as the molar ratio (Ak/Si) is controlled to 0.4 or less, 0.35 or less, or 0.3 or less, hardness, crack resistance and thermal and shock resistance of the cured product can be excellently maintained.

The polyorganosiloxane (B) may include at least one epoxy group binding to a silicon atom, and thus at least one of $R^2$ of Formula 2 is an epoxy group. Since the polyorganosiloxane (B) includes an epoxy group, hardness and scratch resistance of the cured product can be increased, and excellent adhesiveness can be attained without using a tackifier. For example, a ratio (Ep/Si) of moles of the epoxy groups (Ep) binding to all silicon atoms included in the polyorganosiloxane (B) to moles of all silicon atoms (Si) included in the polyorganosiloxane (B) may be 0.15 or less, or 0.1 or less. The ratio (Ep/Si) may be more than 0. In this range, for example, adhesiveness of the curable composition or a cured product thereof can be excellently maintained.

The polyorganosiloxane (B) may include at least one aryl group. When the polyorganosiloxane (B) includes an aryl group, in Formula 2, at least one of $R^{12}$ may be an aryl group. In this case, the aryl group may be present in such an amount that a ratio (Ar/Si) of moles of the aryl group (Ar) to moles of all silicon atoms (Si) in the polyorganosiloxane (B) may be 0.5 to 1.5. As the molar ratio (Ar/Si) is controlled as described above to control a relationship with the refractive index with the polyorganosiloxane (A) within a desired range, refractive index, gas permeability, water transmittance, thermal and shock resistance, crack resistance, and hardness of the cured product, and viscosity of the composition, can all be suitably maintained.

In the average compositional formula of Formula 2, e, f, g and h are molar ratios of respective siloxane units. For example, when the sum of e+g+f+h is adjusted to be 1, e may be 0.05 to 0.5, f may be 0 to 0.5 or 0 to 0.3, g may be 0.6 to 0.95, and h may be 0 to 0.3 or 0 to 0.2. Here, (e+f)/(e+f+g+h) may be 0.2 to 0.7, or 0.2 or more and less than 0.7. In addition, f/(f+g+h) may be less than 0.65, 0.5 or less, or 0.3 or less, and g/(g+h) may be 0.7 or more, or 0.8 or more. The lower limit of f/(f+g+h) is not particularly limited, and for example, f/(f+g+h) may be more than 0. In addition, the upper limit of g/(g+h) is not particularly limited, and may be, for example, 1.0.

The polyorganosiloxane (B) may have a viscosity at 25° C. of 5000 cP or more or 1000000 cP or more, and thus processability before curing and hardness after curing can be suitably maintained.

The polyorganosiloxane (B) may have a molecular weight of, for example, 800 to 100000, or 800 to 20000. When the molecular weight is controlled to 800 or more, moldability before curing or strength after curing can be effectively maintained, and when the molecular weight is controlled to 100000 or less, the viscosity can be maintained at a suitable level.

The polyorganosiloxane (B) may be prepared by applying a conventionally known method of preparing a polyorganosiloxane, or ring-opening polymerization similar to that for the polyorganosiloxane (A).

The polyorganosiloxane (B) may be included in the curable composition in an amount of, for example, 50 parts by weight or more, 70 parts by weight or more, 90 parts by weight or more, 110 parts by weight or more, 130 parts by weight or more, 150 parts by weight or more, 170 parts by weight or more, or 190 parts by weight or more with respect to 100 parts by weight of the polyorganosiloxane (A). In addition, the polyorganosiloxane (B) may be included in the curable composition in an amount of 1000 parts by weight or less, 900 parts by weight or less, 800 parts by weight or less, 750 parts by weight or less, 700 parts by weight or less, 650 parts by weight or less, 600 parts by weight or less, 550 parts by weight or less, 500 parts by weight or less, 450 parts by weight or less, 400 parts by weight or less, 350 parts by weight or less, or 300 parts by weight or less with respect to 100 parts by weight of the polyorganosiloxane (A), but the amount may be changed as needed. Accordingly, a curable composition can have excellent processability, workability, and adhesiveness, and can exhibit excellent light extraction efficiency, crack resistance, hardness, thermal and shock resistance, and adhesiveness after curing, long-lasting durability and reliability even under harsh conditions, and does not cause whitening or surface stickiness.

The curable composition may further include a silicon compound including a hydrogen atom binding to a silicon atom (hereinafter, referred to as "silicon compound (C)"). The silicon compound (C) may have at least one or two hydrogen atoms.

The silicon compound (C) may serve as a crosslinking agent to crosslink a composition by a reaction with a functional group containing an aliphatic unsaturated bond of a polyorganosiloxane. For example, crosslinking and curing may be performed by addition-reacting a hydrogen atom of the silicon compound (C) and an alkenyl group of the polyorganosiloxane (A) or (B).

As the silicon compound (C), any one of various kinds of silicon compounds including a hydrogen atom binding to a silicon atom (Si—H) in a molecule may be used. The silicon compound (C) may be, for example, a linear, branched, cyclic, or crosslinkable polyorganosiloxane. The silicon compound (C) may be a compound having 2 to 1000 silicon atoms, and preferably 3 to 300, silicon atoms.

The silicon compound (C) may be, for example, a compound of Formula 15, or a compound having an average compositional formula of Formula 16.

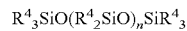 [Formula 15]

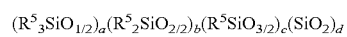 [Formula 16]

In Formulas 15 and 16, $R^4$ are each independently hydrogen or a monovalent hydrocarbon group, at least two of $R^4$ are hydrogen atoms, at least one of $R^4$ is an aryl group, n is 1 to 100, $R^5$ are each independently hydrogen or a monovalent hydrocarbon group, at least two of $R^5$ are a hydrogen atom, at least one of $R^5$ is an aryl group, a is a positive number, b is 0 or a positive number, c is a positive number, and d is 0 or a positive number. For example, when the sum (a+b+c+d) thereof is adjusted to be 1, a is 0.1 to 0.8, b is 0 to 0.5, c is 0.1 to 0.8, and d is 0 to 0.2.

The compound of Formula 15 is a linear siloxane compound having at least two hydrogen atoms binding to a silicon atom. In Formula 15, n may be 1 to 100, 1 to 50, 1 to 25, 1 to 10, or 1 to 5.

The compound represented as the average compositional formula of Formula 16 may be a polysiloxane having a crosslinked structure.

In one embodiment, a molar ratio (H/Si) of a hydrogen atom (H) binding to a silicon atom with respect to all silicon atoms (Si) included in the silicon compound (C) may be 0.2 to 0.8, or 0.3 to 0.75. As the molar ratio is controlled to 0.2 or 0.3 or more, curability of the composition can be excellently maintained, and as the molar ratio is controlled to 0.8 or less, or 0.75 or less, crack resistance and thermal and shock resistance can be excellently maintained.

The silicon compound (C) may include at least one aryl group, and thus at least one of $R^4$ in Formula 15 or at least one of $R^5$ in Formula 16 may be an aryl group. Accordingly, the refractive index and hardness of the cured product can be effectively controlled. The aryl group may be present in such an amount that a molar ratio (Ar/Si) of the aryl group (Ar) with respect to all silicon atoms (Si) included in the compound (C) is 0.5 to 1.5, or 0.5 to 1.3. As the molar ratio (Ar/Si) is controlled to 0.5 or more, the refractive index and hardness of the cured product can be maximized, and as the molar ratio (Ar/Si) is controlled to 1.5 or less, or 1.3 or less, the viscosity and crack resistance of the composition can be suitably maintained.

The compound (C) may have a viscosity at 25° C. of 0.1 cP to 100000 cP, 0.1 cP to 10000 cP, 0.1 cP to 1000 cP, or 0.1 cP to 300cP. In the above range of viscosity, processability of the composition and hardness of the cured product can be excellently maintained.

In addition, the compound (C) may have, for example, a molecular weight of less than 2000, less than 1000, or less than 800. When the molecular weight is 1000 or more, the strength of the cured product may be degraded. The lower limit of the molecular weight of the compound (C) is not particularly limited, and may be, for example, 250. In the compound (C), the molecular weight may be a weight average molecular weight or a conventional molecular weight of the compound.

A method of preparing the compound (C) is not particularly limited, and may employ a conventional method of preparing a polyorganosiloxane known in the art, or a similar method to that of preparing the polyorganosiloxane (A).

A content of the compound (C) may be selected within the range of a molar ratio (H/Ak) of a hydrogen atom (H) binding to a silicon atom included in the compound (C) with respect to all aliphatic unsaturated bond-containing functional groups included in the curable composition, for example, all functional groups (Ak) containing an aliphatic unsaturated bond such as an alkenyl group included in the polyorganosiloxane (A) and/or (B) of 0.5 to 2.0 or 0.7 to 1.5. Within the above range of the molar ratio (H/Ak), a composition which exhibits excellent processability and workability before curing, excellent crack resistance, hardness, thermal and shock resistance, and adhesiveness after curing, and does not cause whitening or surface stickiness even under harsh conditions, can be provided.

The curable composition may further include a hydrosilylation catalyst. The hydrosilylation catalyst may be used to stimulate hydrosilylation. As a hydrosilylation catalyst, any conventional component known in the art may be used. As such a catalyst, a platinum-, palladium- or rhodium-based catalyst may be used. In the specification, a platinum-based catalyst may be used in consideration of catalyst efficiency, and may be, but is not limited to, chloroplatinic acid, platinum tetrachloride, an olefin complex of platinum, an alkenyl siloxane complex of platinum, or a carbonyl complex of platinum.

A content of the hydrosilylation catalyst is not particularly limited as long as the hydrosilylation catalyst is included at a catalytic amount, that is, an amount capable of serving as a catalyst. Conventionally, the hydrosilylation catalyst may be used at 0.1 ppm to 500 ppm, or 0.2 ppm to 100 ppm based on an atomic weight of platinum, palladium or rhodium.

The curable composition may further include at least one of additives including a reaction inhibitor such as 2-methyl-3-butyne-2-ol, 2-phenyl-3-1-butyne-2-ol, 3-methyl-3-pentene-1-yne, 3,5-dimethyl-3-hexene-1-yne, 1,3,5,7-tetramethyl-1,3,5,7-tetrahexenylcyclotetrasiloxane or ethynylcyclohexane; an inorganic filler such as silica, alumina, zirconia or titania; a carbon-functional silane having an epoxy group and/or an alkoxysilyl group, a partial hydrolysis-condensation product thereof or a siloxane compound; a thixotropic agent such as a haze-phase silica that can be used in combination with polyether; a conductivity providing agent such as metal powder of silver, copper or aluminum or various carbon materials; or a color adjusting agent such as a pigment or dye, as needed.

The curable composition may also include particles, for example, inorganic particles. The particles may satisfy Equation 1.

$$|P-Q| \leq 0.1 \quad \text{[Equation 1]}$$

In Equation 1, P is a refractive index of the curable composition or a cured product thereof except the particles, and Q is a refractive index of the particles. The refractive index may be a refractive index measured with respect to light having a wavelength of 450 nm An absolute value of the difference between P and Q, that is, $|P-Q|$, may be, in another example, 0.08 or less, 0.07 or less, or 0.05 or less.

The particles may prevent precipitation of a fluorescent material capable of being blended in the curable composition, and enhance thermal resistance, thermal releasing property, and crack resistance, thereby improving overall reliability. In addition, the particles may serve as described above and maintain transparency of the composition or a cured product thereof, thereby enhancing brightness of an element.

As the particles, as long as they satisfy Equation 1, for example, various kinds of particles used as a filler in the art may be used. In one embodiment, the particles may have a refractive index (Q) of 1.40 or more, 1.45 or more, 1.48 or more, 1.50 or more, or 1.55 or more.

For example, the particles may be silica ($SiO_2$), organo silica, alumina, alumino silica, titania, zirconia, cesium oxide, hafnium oxide, niobium pentoxide, tantalum pentoxide, indium oxide, tin oxide, indium tin oxide, zinc oxide, silicon, zinc sulfide, calcium carbonate, barium sulfate, aluminosilicate or magnesium oxide, and may be porous or hollow particles.

The particles may have an average diameter of, for example, 1 nm to 50 μm, or 2 nm to 10 μm. When the average diameter is 1 nm or more, the particles may be uniformly dispersed in the composition or cured product thereof, and when the average diameter is 50 μm or less, dispersion of the particles may be effectively performed, and precipitation of the particles may be prevented.

The particles may be included at 0.1 to 30 parts by weight, or 0.2 to 10 parts by weight with respect to 100 parts by weight of a total weight of the polyorganosiloxane (A) or (B) and the silicon compound (C). When the content of the particles is 0.1 parts by weight or more, excellent inhibition of precipitation of a fluorescent material or enhancement of reliability of an element can be ensured, and when the content of the particles is 30 parts by weight or less, processability can be excellently maintained.

The curable composition may further include a fluorescent material. In this case, the kind of a fluorescent material which can be used is not particularly limited and, for example, a conventional kind of fluorescent material applied to an LED package may be used to realize white light.

Another aspect of the present application provides a semiconductor element, for example, an optical semiconductor element. The exemplary semiconductor element may be encapsulated by an encapsulant including a cured product of the curable composition. Examples of a semiconductor element encapsulated by an encapsulant include a diode, a transistor, a thyristor, a photocoupler, a CCD, a solid-phase image pick-up element, a monolithic IC, a hybrid IC, an LSI, a VLSI or a light-emitting diode (LED). In one embodiment, the semiconductor element may be an LED.

The LED may be formed by stacking a semiconductor material on a substrate. The semiconductor material may be, but is not limited to, GaAs, GaP, GaAlAs, GaAsP, AlGaInP, GaN, InN, AlN, InGaAlN or SiC. In addition, as the substrate, monocrystalline sapphire, spinel, SiC, Si, ZnO or GaN may be used.

In addition, to prepare the LED, when necessary, a buffer layer may be formed between a substrate and a semiconductor material. As the buffer layer, GaN or AlN may be used. A method of stacking a semiconductor material on a substrate may be, but is not particularly limited to, MOCVD, HDVPE or liquid growth. In addition, a structure of the LED may be, for example, a monojunction including an MIS junction, a PN junction, and a PIN junction, a heterojunction, or a double heterojunction. In addition, the LED may be formed using a single or multiple quantum well structure.

In one embodiment, an emission wavelength of the LED may be, for example, 250 nm to 550 nm, 300 nm to 500 nm, or 330 nm to 470 nm. The emission wavelength may refer to a main emission peak wavelength. As the emission wavelength of the LED is set in the above range, a white LED having a longer life span, a high energy yield and high color expression can be obtained.

The LED may be encapsulated using the composition. In addition, the encapsulation of the LED may be performed only using the composition, and in some cases, another encapsulant may be used in combination with the composition. When two kinds of encapsulants are used in combination, after the encapsulation using the composition, the encapsulated LED may also be encapsulated with another encapsulant. Alternatively, the LED may be first encapsulated with the other encapsulant and then encapsulated again with the composition. As the other encapsulant, an epoxy resin, a silicon resin, an acryl resin, a urea resin, an imide resin, or glass may be used.

To encapsulate the LED with the composition, for example, a method including injecting the composition into a mold beforehand, dipping a lead frame to which the LED is fixed therein and curing the composition may be used. Alternatively, a method including injecting the composition into a mold into which the LED is inserted and curing the composition may be used. As a method of injecting the composition, injection by a dispenser, transfer molding, or injection molding may be used. In addition, as other encapsulating methods, a method of dropping the composition on the LED, coating the composition by screen printing or using a mask and curing the composition, and a method of injecting the composition into a cup in which the LED is disposed on its bottom by a dispenser and curing the composition may be included.

In addition, the composition may be used as a diamond material fixing the LED to a lead terminal or package, or a passivation layer or package substrate on the LED, as needed.

When it is necessary to cure the composition, the curing is not particularly limited, and may be performed, for example, by maintaining the composition at a temperature of 60° C. to 200° C. for 10 minutes to 5 hours, or in 2 or more steps at suitable temperatures and for suitable amounts of time.

A shape of the encapsulant is not particularly limited and, for example, may be a bullet-shape lens, planar, or thin film shape.

In addition, further enhancement of performance of the LED may be promoted according to conventional methods known in the art. To enhance performance, for example, a method of disposing a reflective layer or light collecting layer on a back surface of the LED, a method of forming a complementary coloring part on its bottom, a method of disposing a layer absorbing light having a shorter wavelength than the main emission peak on the LED, a method of encapsulating the LED and further molding the LED with a lightweight material, a method of inserting the LED into a through hole to be fixed, or a method of contacting the LED with a lead member by flip-chip contact to extract light from a direction of the substrate, may be used.

The LED may be effectively applied to, for example, backlights for liquid crystal displays (LCDs), lights, various kinds of sensors, light sources of a printer and a copy machine, light sources for an automobile gauge, signal lights, pilot lights, display elements, light sources of planar-type LEDs, displays, decorations, or various kinds of lights.

Effect

According to the present application, a curable composition can be provided that has excellent processability, workability and adhesiveness, exhibits excellent light extraction efficiency, crack resistance, hardness, thermal and shock resistance, and adhesiveness after curing, and long-lasting durability and reliability even under harsh conditions, and does not cause whitening or surface stickiness. The curable composition may be used as an encapsulant or adhesive material for an optical semiconductor such as an LED.

Illustrative Embodiments

Hereinafter, polyorganosiloxanes and a curable composition according to the present application will be described in further detail with reference to Examples and Comparative Examples, but the range of the polyorganosiloxanes is not limited to the following Examples. Hereinafter, the abbreviation "Vi" refers to a vinyl group, the abbreviation "Ph" refers to a phenyl group, the abbreviation "Me" refers to a methyl group, and the abbreviation "Ep" refers to a 3-glycidoxypropyl group.

1. Measurement of Light Transmittance

A curable composition was injected between two glass substrates spaced approximately 1 mm apart from each other and cured at 150° C. for 1 hour, thereby preparing a planar sample having a thickness of 1 mm Subsequently, light transmittance of the sample in a thickness direction with respect to a wavelength of 450 nm was measured using a UV-VIS spectrometer at room temperature and then evaluated according to the following criteria.

<Criteria for Evaluating Light Transmittance>
◯: light transmittance of 98% or more
×: light transmittance of less than 98%

2. Evaluation of Characteristics of Element

Characteristics of an element were evaluated using a 6020 LED package manufactured of polyphthalamide (PPA). Specifically, a curable composition was dispensed in a PPA cup, maintained at 70° C. for 30 minutes, and then cured at 150° C. for 1 hour, thereby manufacturing a surface-mounting LED.

Afterward, thermal shock and long-lasting reliability tests were performed according to the following methods.

(1) Thermal Shock Test

The LED was maintained at −40° C. for 30 minutes, and maintained again at 100° C. for 30 minutes, which was set as one cycle, and the above-described process was repeated 10 times, that is, for 10 cycles, and then the LED was maintained at room temperature to investigate a state of peeling, thereby evaluating thermal and shock resistance. For evaluation, 10 LEDs manufactured of the same curable composition were tested as described above and numbers of peeled LEDs are shown in Table 1.

(2) Long-Lasting Reliability Test

The manufactured LED was operated for 200 hours while 30 mA of current was supplied under conditions of 85° C. and relative humidity of 85%.

Subsequently, a reduction rate of brightness after operation compared to initial brightness before operation was measured and evaluated according to the following criteria.

<Evaluation Criteria>
◯ brightness reduction rate of 10% or less with respect to the initial brightness
×: brightness reduction rate of more than 10% with respect to initial brightness

EXAMPLE 1

A curable composition was prepared by blending 50 g of a polyorganosiloxane of Formula A, 100 g of a polyorganosiloxane of Formula B, and 30 g of a polyorganosiloxane of Formula C, which were prepared by conventional methods, blending a catalyst (Platinum(0)-1,3-divinyl-1,1,3,3-tetramethyldisiloxane) to have a content of Pt(0) of 5 ppm, and uniformly mixing the resulting mixture.

$(ViMe_2SiO_{1/2})_2(MePhSiO_{2/2})_{40}$ [Formula A]

$(ViMe_2SiO_{1/2})_2(EpMeSiO_{2/2})_{0.4}(PhSiO_{3/2})_8$ [Formula B]

$(HMe_2SiO_{1/2})_2(HMeSiO_{2/2})_{0.5}(Ph_2SiO_{2/2})_{1.5}$ [Formula C]

EXAMPLE 2

A curable composition was prepared by mixing 50 g of a polyorganosiloxane of Formula D, 100 g of a polyorganosiloxane of Formula E, 25 g of a polyorganosiloxane of Formula F, and 10 g of a polyorganosiloxane of Formula G, which were prepared by conventional methods, blending a catalyst (Platinum(0)-1,3-divinyl-1,1,3,3-tetramethyldisiloxane) to have a content of Pt(0) of 5 ppm, and uniformly mixing the resulting mixture.

$[ViMe_2SiO_{1/2}]_2[Me_2SiO_{2/2}]_{23}[Ph_2SiO_{2/2}]_{20}$ [Formula D]

$[ViMe_2SiO_{1/2}]_2[MePhSiO_{2/2}][EPMeSiO_{2/2}]_{0.4}[PhSiO_{3/2}]_8$ [Formula E]

$(HMe_2SiO_{1/2})_2(Ph_2SiO_{2/2})_{1.5}$ [Formula F]

$[HMe_2SiO_{1/2}]_3[PhSiO_{3/2}]_3$ [Formula G]

COMPARATIVE EXAMPLE 1

A curable composition was prepared by the same method as described in Example 1, except that the polyorganosiloxane of Formula A was not used.

COMPARATIVE EXAMPLE 2

A curable composition was prepared by the same method as described in Example 2, except that the polyorganosiloxane of Formula D was not used.

COMPARATIVE EXAMPLE 3

A curable composition was prepared by the same method as described in Example 1, except that the polyorganosiloxane of Formula B was not used, and the polyorganosiloxane of Formula H was used.

$(ViMe_2SiO_{1/2})_2(PhSiO_{3/2})_8$ [Formula H]

COMPARATIVE EXAMPLE 4

A curable composition was prepared by the same method as described in

EXAMPLE 1, except that the polyorganosiloxane of Formula B was not used, and the polyorganosiloxane of Formula I was used.

$(ViMe_2SiO_{1/2})_2(EpMeSiO_{2/2})_3(PhSiO_{3/2})_6$ [Formula I]

TABLE 1

| | | Light transmittance | Thermal and shock resistance | Reliability |
|---|---|---|---|---|
| Example | 1 | O | 0/10 | O |
| | 2 | O | 0/10 | O |
| Comparative Example | 1 | O | 10/10 | X |
| | 2 | O | 8/10 | X |
| | 3 | O | 9/10 | X |
| | 4 | X | 6/10 | X |

What is claimed is:

1. A curable composition, comprising:
   (A) a polyorganosiloxane having an average compositional formula of Formula 1;
   (B) a polyorganosiloxane which has an average compositional formula of Formula 2 and in which a ratio (Ep/Si) of moles of an epoxy group (Ep) to moles of a silicon atom (Si) is 0.15 or less; and
   (C) a compound having a hydrogen atom binding to a silicon atom, $(R^1{}_3SiO_{1/2})_a(R^1{}_2SiO_{2/2})_b(R^1SiO_{3/2})_c(SiO_{4/2})_d$ [Formula 1]

$(R^2{}_3SiO_{1/2})_e(R^2{}_2SiO_{2/2})_f(R^2SiO_{3/2})_g(SiO_{4/2})_h$ [Formula 2]

wherein $R^1$'s are each independently a monovalent hydrocarbon group, $R^2$'s are each independently an epoxy group or a monovalent hydrocarbon group, with the proviso that at least one of $R^1$'s is an alkenyl group and at least one of $R^2$'s is an alkenyl group and at least one of $R^2$'s is an epoxy group; and a is 0 or a positive number, b is a positive number, c is 0 or a positive number, d is 0 or a positive number, b/(b+c+d) is 0.65 or more, e is a positive number, f is 0 or a positive number, g is a positive number, h is 0 or a positive number, and f/(f+g+h) is less than 0.65.

2. The curable composition according to claim 1, wherein a ratio (Ak/Si) of moles of the alkenyl group (Ak) to moles of all silicon atoms (Si) in the polyorganosiloxane (A) is from 0.01 to 0.2.

3. The curable composition according to claim 1, wherein the polyorganosiloxane (A) comprises at least one aryl group binding to a silicon atom.

4. The curable composition according to claim 3, wherein a ratio (Ar/Si) of moles of the aryl group (Ar) to moles of all silicon atoms (Si) in the polyorganosiloxane (A) is from 0.5 to 1.5.

5. The curable composition according to claim 1, wherein a ratio (Ak/Si) of moles of the alkenyl group (Ak) to moles of all silicon atoms (Si) in the polyorganosiloxane (B) is from 0.05 to 0.4.

6. The curable composition according to claim 1, wherein the polyorganosiloxane (B) comprises at least one aryl group binding to a silicon atom.

7. The curable composition according to claim 6, wherein a ratio (Ar/Si) of moles of the aryl group (Ar) to moles of all silicon atoms (Si) in the polyorganosiloxane (B) is from 0.5 to 1.5.

8. The curable composition according to claim 1, wherein a ratio (Ep/Si) of moles of the epoxy group (Ep) to moles of all silicon atoms (Si) in the polyorganosiloxane (B) is 0.1 or less.

9. The curable composition according to claim 1, wherein (e+f)/(e+f+g+h) is 0.2 to 0.7, f/(f+g+h) is 0.3 or less, and g/(g+h) is 0.8 or more in Formula 2.

10. The curable composition according to claim 1, wherein a viscosity of the polyorganosiloxane (B) is 5,000 cP or more at 25° C.

11. The curable composition according to claim 1, wherein a weight average molecular weight of the polyorganosiloxane (B) is from 800 to 100,000.

12. The curable composition according to claim 1, wherein the polyorganosiloxane (B) is comprised in an amount of 50 parts by weight or more relative to 100 parts by weight of the polyorganosiloxane (A).

13. The curable composition according to claim 1, wherein the silicon compound (C) is a compound of Formula 15, or a compound having an average compositional formula of Formula 16:

$$R^4_3SiO(R^4_2SiO)_nSiR^4_3 \quad \text{[Formula 15]}$$

$$(R^5_3SiO_{1/2})_a(R^5_2SiO_{2/2})_b(R^5SiO_{3/2})_c(SiO_2)_d \quad \text{[Formula 16]}$$

wherein $R^4$'s are each independently hydrogen or a monovalent hydrocarbon group, with the proviso that at least two of $R^4$'s are hydrogen atoms and at least one of $R^4$'s is an aryl group; n is from 1 to 100, $R^5$'s are each independently hydrogen or a monovalent hydrocarbon group and at least two of $R^5$ are hydrogen atoms and at least one of $R^5$'s is an aryl group; and a is a positive number, b is 0 or a positive number, c is a positive number, and d is a positive number.

14. The curable composition according to claim 1, wherein a ratio (H/Si) of moles of a hydrogen atom (H) binding to a silicon atom to moles of all silicon atoms (Si) in the silicon compound (C) is from 0.2 to 0.8.

15. The curable composition according to claim 1, wherein the silicon compound (C) comprises at least one aryl group binding to a silicon atom.

16. The curable composition according to claim 15, wherein a ratio (Ar/Si) of moles of the aryl group (Ar) to moles of all silicon atoms (Si) in the silicon compound (C) is from 0.5 to 1.5.

17. The curable composition according to claim 1, wherein a ratio (H/Ak) of moles of the hydrogen atoms (H) binding to all silicon atoms in the silicon compound (C) to moles of all alkenyl groups (Ak) in the polyorganosiloxane (A) and the polyorganosiloxane (B) is from 0.5 to 2.0.

18. An optical semiconductor encapsulated by the cured composition of claim 1.

19. A liquid crystal display comprising the optical semiconductor of claim 18 in a backlight unit.

20. A lighting apparatus comprising the optical semiconductor of claim 18.

* * * * *